United States Patent
Nangia et al.

(10) Patent No.: US 11,387,155 B2
(45) Date of Patent: Jul. 12, 2022

(54) IC HAVING A METAL RING THEREON FOR STRESS REDUCTION

(71) Applicant: Texas Instruments Incorporated, Dallas, TX (US)

(72) Inventors: Amit Sureshkumar Nangia, Murphy, TX (US); Sreenivasan Kalyani Koduri, Allen, TX (US); Siva Prakash Gurrum, Allen, TX (US); Christopher Daniel Manack, Flower Mound, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/859,530

(22) Filed: Apr. 27, 2020

(65) Prior Publication Data

US 2021/0183717 A1   Jun. 17, 2021

Related U.S. Application Data

(60) Provisional application No. 62/947,068, filed on Dec. 12, 2019.

(51) Int. Cl.
*H01L 23/16*   (2006.01)
*H01L 23/00*   (2006.01)

(52) U.S. Cl.
CPC .............. *H01L 23/16* (2013.01); *H01L 24/97* (2013.01); *H01L 2224/73265* (2013.01); *H01L 2924/14* (2013.01)

(58) Field of Classification Search
CPC ..................... H01L 23/16; H01L 24/97; H01L 2224/73265
See application file for complete search history.

(56) References Cited

U.S. PATENT DOCUMENTS

| 7,651,891 | B1 | 1/2010 | Nguyen |
| 9,355,968 | B2 | 5/2016 | Cheng et al. |
| 2013/0050228 | A1* | 2/2013 | Petersen ............... B81C 1/0023 345/501 |
| 2015/0035130 | A1* | 2/2015 | How ..................... H01L 23/315 257/678 |
| 2020/0182661 | A1* | 6/2020 | Hunziker ............. G01D 11/245 |

* cited by examiner

*Primary Examiner* — Errol V Fernandes
(74) *Attorney, Agent, or Firm* — Ronald O. Neerings; Charles A. Brill; Frank D. Cimino (57) ABSTRACT

An integrated circuit (IC) includes a substrate including circuitry configured for a function, the circuitry including at least one stress sensitive circuit portion, with at least a portion of nodes in the circuitry electrically coupled to bond pads provided by a top metal layer. A metal wall that is ring-shaped is positioned above the top metal layer that is not electrically coupled to the circuitry. The stress sensitive circuit portion is with at least a majority of its area within an inner area of the substrate that is framed by the metal wall to provide a cavity.

24 Claims, 13 Drawing Sheets

IC HAVING A METAL RING THEREON FOR STRESS REDUCTION

CROSS-REFERENCE TO RELATED APPLICATIONS

This application claims the benefit of Provisional Application Ser. No. 62/947,068 entitled "Novel approach for localized package stress reduction on Silicon using FCOL", filed Dec. 12, 2019, which is herein incorporated by reference in its entirety.

FIELD

This Disclosure relates to integrated circuits (ICs) and packaged devices including at least one IC including plastic packages.

BACKGROUND

There are known to be parametric shifts, drifts and variations for packaged devices that include at least one IC that comprises stress sensitive circuitry due to package stress, and more specifically mold compound induced stress. As examples, for precision analog devices, which is one example type of stress sensitive circuitry, package stress can result in a higher non-linearity in case of precision analog to digital converters (ADCs), higher offset voltage or offset voltage drift in case of amplifiers, and lower accuracy and higher noise for reference circuits. Precision analog devices often include matching circuits, but not always, such as in the cases of references and bandgap circuits which may not be matching circuit-based. Although gradient cancelation techniques such as at test trim (implemented either at the IC/wafer level or at package level test) are known that can be used to minimize these performance problems, such performance problems still tend to show up as unit-to-unit between a population of packaged device units, variability such as across temperature, post-operating life or reliability stress, and a resulting degraded performance and corresponding lower performance specification for the packaged device.

One known packaged device arrangement comprises flipchip on leadframe (FCOL). For FCOL, the top side of an IC generally comprising a silicon substrate and having solder capped pillars on its bond pads is bonded to the leads or lead terminals of the leadframe for providing both the thermal and electrical connections directly from the substrate of the IC to the leadframe.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects include an IC comprising a substrate including circuitry configured for a function, the circuitry including at least one stress sensitive circuit portion, with at least a portion of nodes in the circuitry electrically coupled to bond pads provided by a top metal layer. A metal wall that is ring-shaped is positioned above the top metal layer that is not electrically coupled to the circuitry. The stress sensitive circuit portion is positioned with at least a majority of its area within an inner area of the substrate framed by the metal wall.

Disclosed aspects also include a packaged device including a disclosed IC. As used herein, the term 'packaged devices' include leadframe-based devices including at least one IC that are molded devices, with or without wirebonding such as a FCOL arrangement, where a disclosed packaged device can also optionally include bond wires. The metal wall prevents at least a portion of the mold compound (e.g., at least the filler particles in the mold compound) from entering an inner cavity that comprises the inner area which is framed by the metal wall.

BRIEF DESCRIPTION OF THE DRAWINGS

Reference will now be made to the accompanying drawings, which are not necessarily drawn to scale, wherein:

FIG. 3A-3C depict successive results from disclosed method steps for forming a packaged device comprising an open cavity sensor, where the leadframe has an opening so that the stress sensitive circuit portion on the IC enclosed by the metal wall is exposed to the atmosphere. This process flow follows the same flow described above through FIGS. 2A-2I, so it will not be repeated in this series of FIGS.

DETAILED DESCRIPTION

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

Figure 1A:
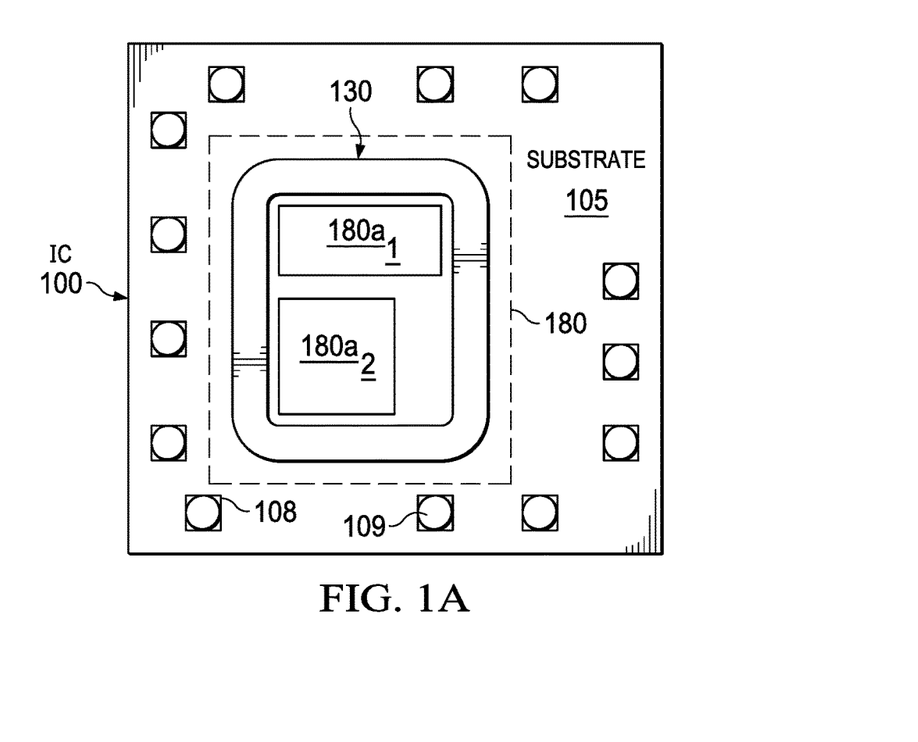
FIG. 1A shows a top view depiction of a disclosed IC having an example metal wall shown as a continuous metal wall around stress sensitive circuit portions of its circuitry, where the stress sensitive circuit portions are shown optionally positioned entirely within an inner area of the substrate framed by the metal wall, according to an example aspect.

FIG. 1A shows a top view depiction of a disclosed IC 100 comprising a substrate 105 having an example metal wall 130 that is shown being continuous that is positioned around its stress sensitive circuit portions $180a_1$ and $180a_2$ of its circuitry 180 that is formed in the substrate 105. The circuitry 180 comprises circuit elements (including transistors, and generally diodes, resistors, capacitors, etc.) formed in the substrate 105, such as comprising an epitaxial layer on a bulk substrate material such as silicon, configured together for generally realizing at least one circuit function. Example circuit functions include analog (e.g., amplifier or power converter), radio frequency (RF), digital, or non-volatile memory functions.

The IC 100 includes a top metal layer including bond pads 108, and there are a plurality of bumps 109, such as pillars, on the bond pads 108. In the case the IC 100 includes at least one redistribution layer (RDL), the bumps can comprise bump pads. The metal wall 130 is ring-shaped shown by example in FIG. 1A being rectangular, and is positioned above the top metal layer, and unlike the bond pads 108, is not electrically coupled to the circuitry 180. As used herein, the ring-shape can be circular or substantially circular, elliptical, rectangular, or square-shaped. Although the metal wall 130 in FIG. 1A is shown as being a continuous wall, disclosed metal walls may also be discontinuous walls as shown in FIG. 1D described below. Disclosed metal walls such as the metal wall 130 generally comprise copper (Cu), that can be applied post metallization and passivation processing.

The metal wall 130 generally has a width that is between 10 μm and 200 μm. A typical ratio of the width of the metal wall 130 to a height of the metal wall 130 is typically between 0.5 to 2. The area enclosed by the metal wall 130 can vary significantly. The metal wall 130 can be rectangular in shape as shown in FIG. 1A, circular, or another shape. The metal wall 130 can have a relatively large area, such as a 3 mm×3 mm square, or relatively small area, such as being 100 micron×100 micron in area, and being square in shape.

The stress sensitive circuit portions $180a_1$ and $180a_2$ are shown optionally positioned entirely within an inner area of the substrate 105 framed by the metal wall 130. The metal wall 130 frames an inner area for the stress sensitive circuit portions $180a_1$ and $180a_2$.

Figure 1B:
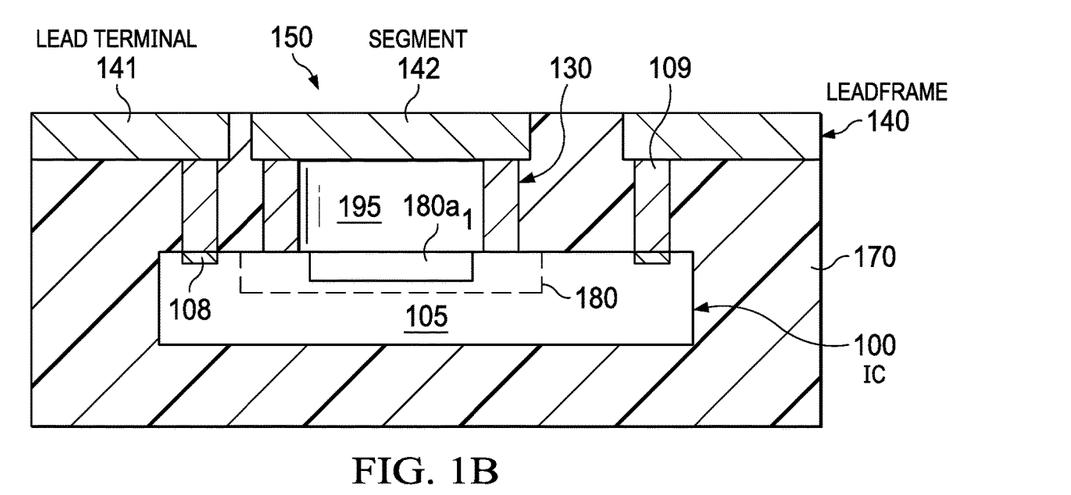
FIG. 1B shows a cross-sectional view of the IC shown in FIG. 1A bonded to a leadframe to provide a packaged device, where the bumps on the bond pads of the IC are shown bonded to lead terminals of the leadframe.

FIG. 1B shows a cross-sectional view of the IC 100 shown in FIG. 1A bonded to a leadframe 140 to provide a leadless packaged device 150, where the bumps 109 on the bond pads 108 of the IC 100 are shown bonded to lead terminals 141 of the leadframe 140. The leadframe 140 includes a leadframe segment 142 that the metal wall 130 is shown positioned on. Nodes for the IC 100 in FIG. 1B are shown connected to some of the bumps 109 in FIG. 1A, which although not shown generally include bumps 109 coupled to the stress sensitive circuit portions $180a_1$ and $180a_2$ shown as stress sensitive circuit portion $180a_1$ in FIG. 1B. The nodes for the stress sensitive circuit portions $180a_1$ and $180a_2$ may also connect to other nodes in the circuitry 180. The leadless packaged device 150 is shown including a mold compound 170.

In the case of a leaded or a leadless packaged device such as the leadless packaged device 150 shown in FIG. 1B, after the IC is bonded to the leads or lead terminals of the leadframe, and molding follows to form the mold compound 170, the metal wall being positioned around the stress sensitive circuit portion(s) on the IC prevents at least a portion of the mold compound 170 from entering the inner area of the substrate. More specifically, the cavity 195 defined by the metal wall 130 prevents the mold compound filler particles from reaching locations on the stress sensitive circuit portions $180a_1$, $180a_2$. In the case of a mold compound including filler particles, disclosed metal walls can prevent entry into the inner area of the mold compound's filler particles when they are above a certain size. In a typical mold compound arrangement, the filler particles (generally being silica particles) can comprise 80 to 90% (by weight) of the mold compound 170.

By including a disclosed metal wall, there is thus decoupling of the stress sensitive circuit portions $180a_1$, $180a_2$ from at least the mold compound's 170 filler particle induced stresses, because a low-stress region is created in the inner area of the substrate 105 framed by the metal wall 130. The metal wall 130 thus protects the IC's stress sensitive circuit portion(s) by preventing degradation (either systematic or random) of the parametric performance for disclosed packaged devices.

Figure 1C:
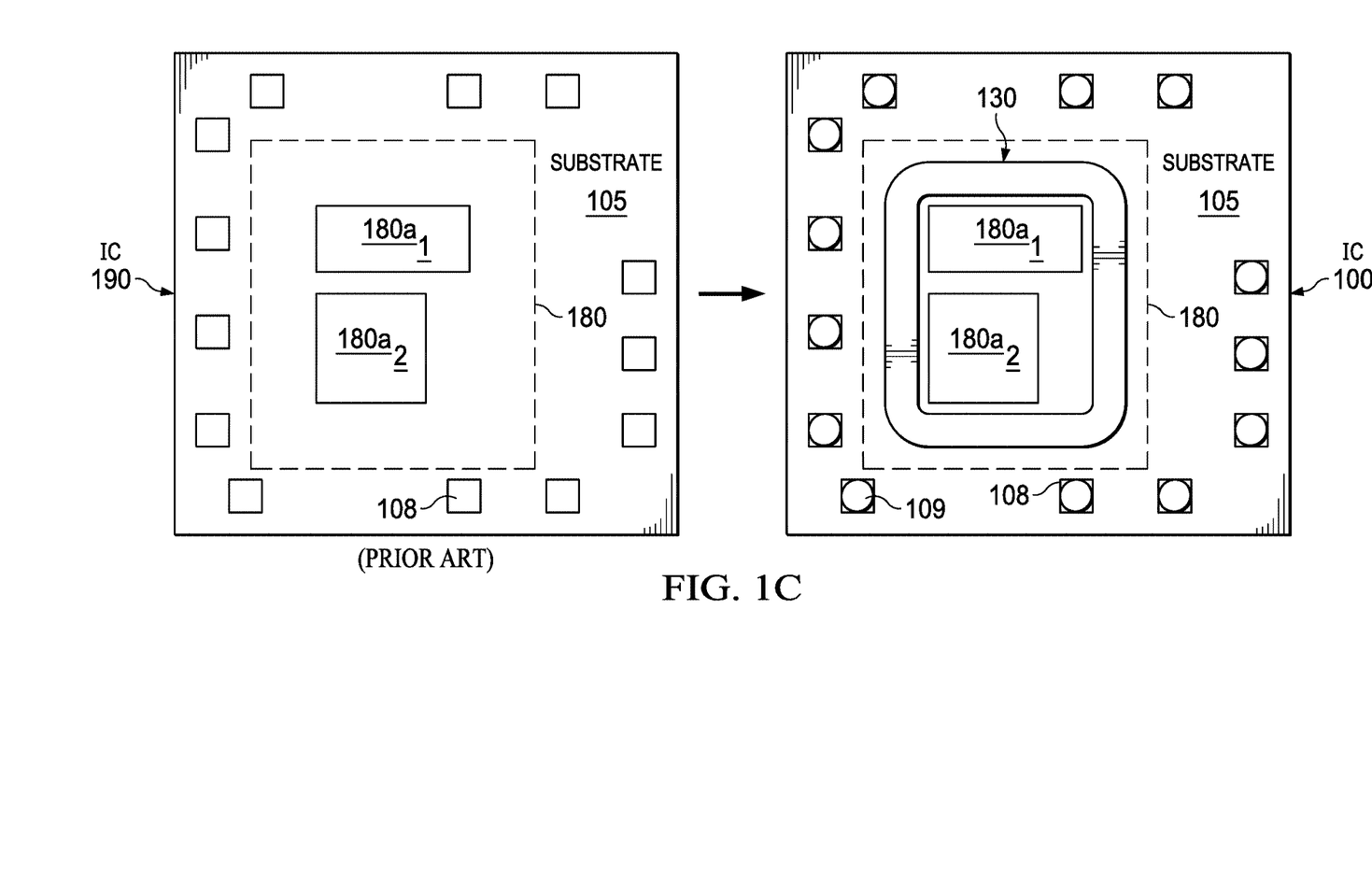
FIG. 1C depicts the repurposing of an IC die on the left side having conventional bond pads by adding FCOL bumps and a disclosed metal wall surrounding the stress sensitive circuit portions on the IC to provide the IC shown in FIG. 1A.
Figure 1D:
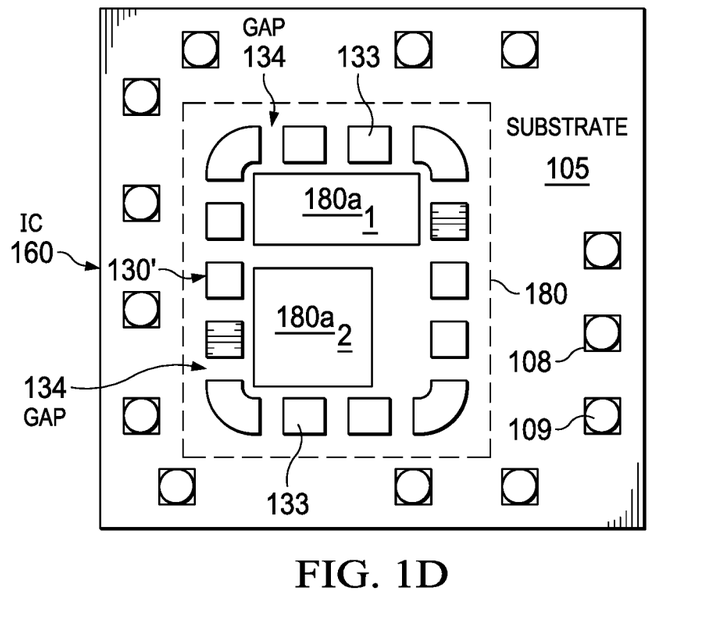
FIG. 1D shows a top view depiction of a disclosed IC having an example discontinuous metal wall around stress sensitive circuit portions of its circuitry. The stress sensitive circuit portions are again shown optionally positioned entirely within an inner area of the substrate framed by the metal wall.

FIG. 1C depicts the repurposing of an IC 190 on the left side having conventional bond pads 108. IC 190 shown on the right side of FIG. 1C is repurposed by adding bumps 109 and a disclosed metal wall 130 surrounding the stress sensitive circuit portions $180a_1$ and $180a_2$ on the IC to provide the IC 100 shown in FIG. 1A, which is again shown in FIG. 1C as IC 100.

FIG. 1D shows a top view depiction of a disclosed IC 160 having an example metal wall 130' that is discontinuous wall which is positioned around the stress sensitive circuit portions $180a_1$ and $180a_2$ of its circuitry 180. The stress sensitive circuit portions $180a_1$ and $180a_2$ are again shown optionally positioned entirely within an inner area of the substrate 105 framed by the metal wall 130'. The metal wall 130' can be seen to comprise a plurality of staggered protruding features 133 which may comprise pillars or posts having gaps 134 between the protruding features 133.

FIG. 2A to 2I depict successive results from an example manufacturing flow for forming a disclosed IC 200 analogous to the IC 100 described above except IC 200 generally includes an environmental sensor, where IC 200 has a metal wall 130 surrounding the stress sensitive circuit portion 180a on the IC 200. FIG. 2J shows the results after mounting a disclosed IC 200 having a metal wall 130 onto a leadframe 140, and the forming of a mold compound 170, singulating into packaged devices from the leadframe strip, with FIG. 2L showing the packaged device mounted onto a PCB 265. This manufacturing flow forms precision packaged ICs, which include a cavity shown in FIG. 2L as 195, where the walls of the cavity 195 are framed by the metal wall 130. Packaged devices formed by this flow generally have IC 200 including an environmental sensor, such as a humidity, light, or a sound sensor.

Figure 2A:
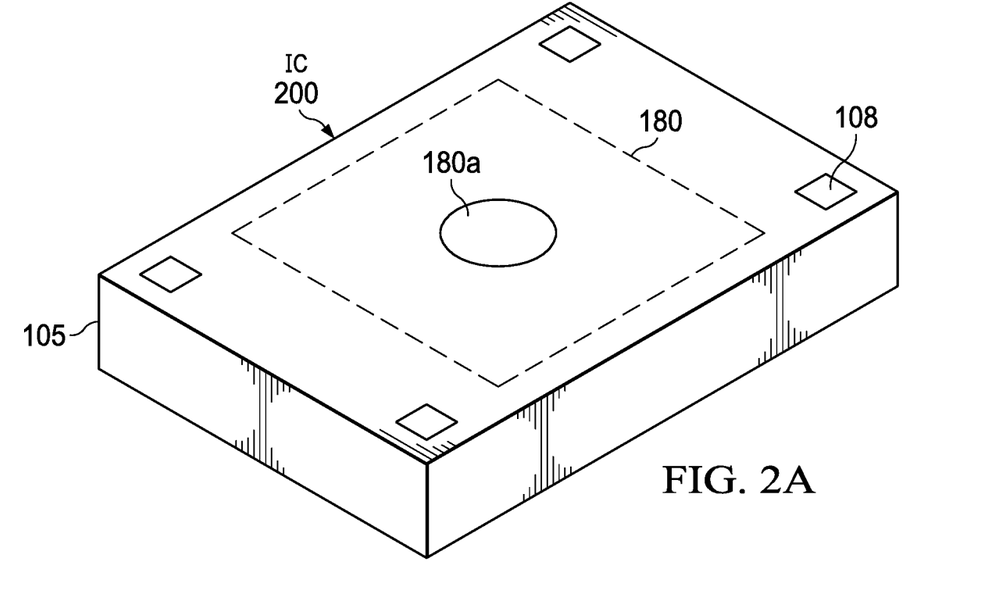
FIGS. 2A-2J depict successive results from method steps for an example manufacturing flow for forming a disclosed IC having a disclosed metal wall surrounding the stress sensitive circuit portion on the IC, with FIG. 2K shows a resulting packaged device after mounting the IC on a leadframe and then molding to form a mold compound. The packaged device includes a disclosed cavity over the sensitive portion of the IC, with the cavity walls being provided by the metal wall.

In FIG. 2A an IC 200 is shown comprising a substrate 105 having circuitry 180 including a stress sensitive circuit portion shown as 180a. At this point in the process the IC 200 is in the form of a wafer having a plurality of the ICs physically connected to one another by the substrate 105, where the wafer has completed its back end of the line (BEOL) processing including multilevel metallization and one or more patterned passivation layers on top of the top metal layer of the multilayer metal stack.

Figure 2B:
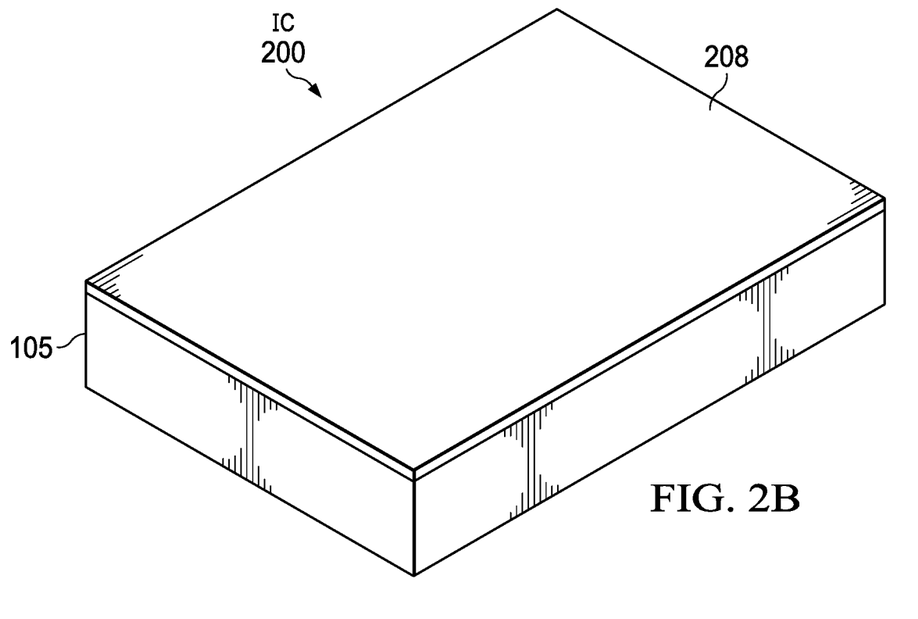
Figure 2C:
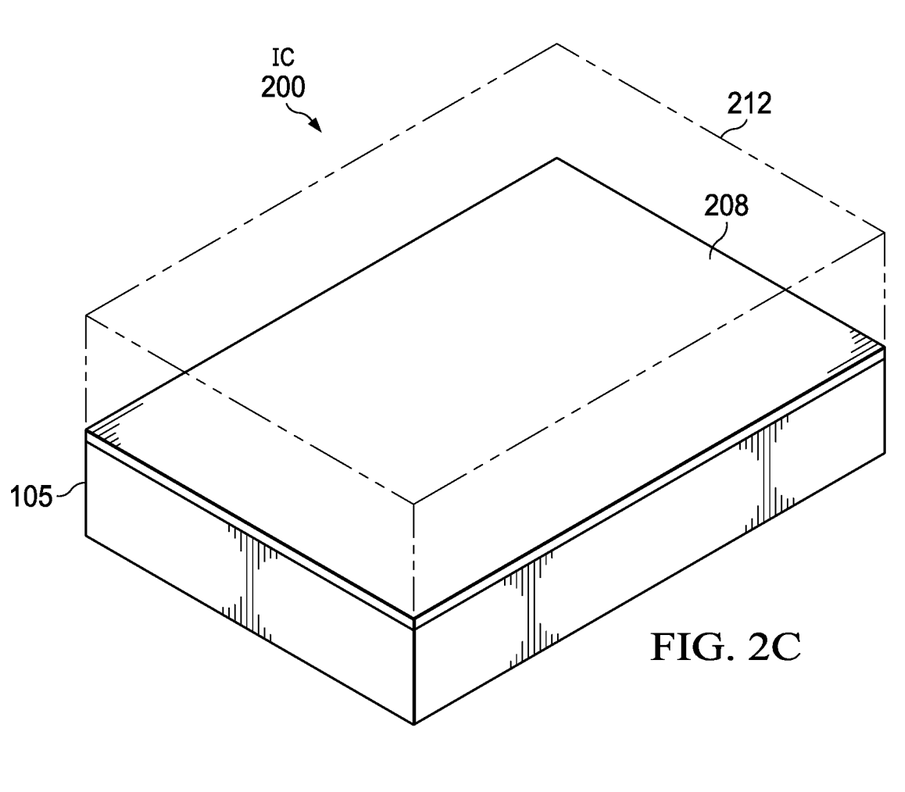
Figure 2D:
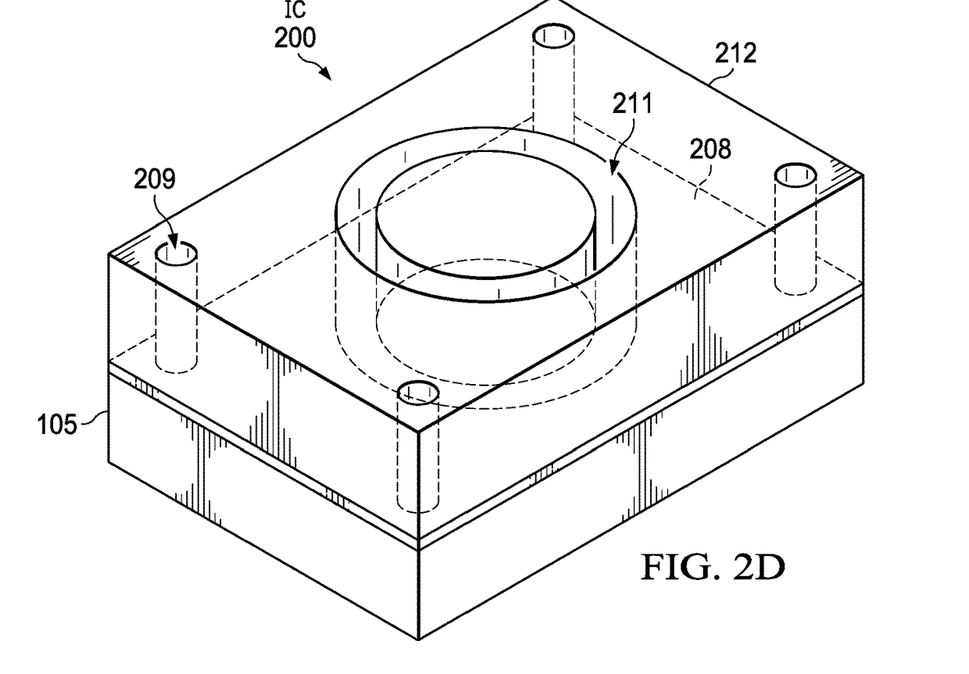

FIG. 2B shows the results for IC 200 after coating the top surface of the IC 200 with a seed metal layer 208. The seed metal layer 208 may comprise for example Ti or TiW, which can be deposited by a process comprising sputtering. FIG. 2C shows the results for IC 200 after a layer of photoresist 212 is applied on top of the seed metal layer 208. FIG. 2D shows the results for IC 200 after exposing and developing the layer of photoresist 212 to provide the ring pattern 211 shown and the cylindrical-shaped openings 209, which in both cases exposes a portion of the seed metal layer 208. The area enclosed by the ring pattern 211 is large enough to optionally enclose the entire area of the stress sensitive circuit portion(s) on the IC 200. The shapes shown for the ring pattern 211 and cylindrical-shaped openings 209 are only for example. As an alternative to the photoresist 212, a layer of dielectric material may also be patterned over the seed metal layer 208.

Figure 2E:
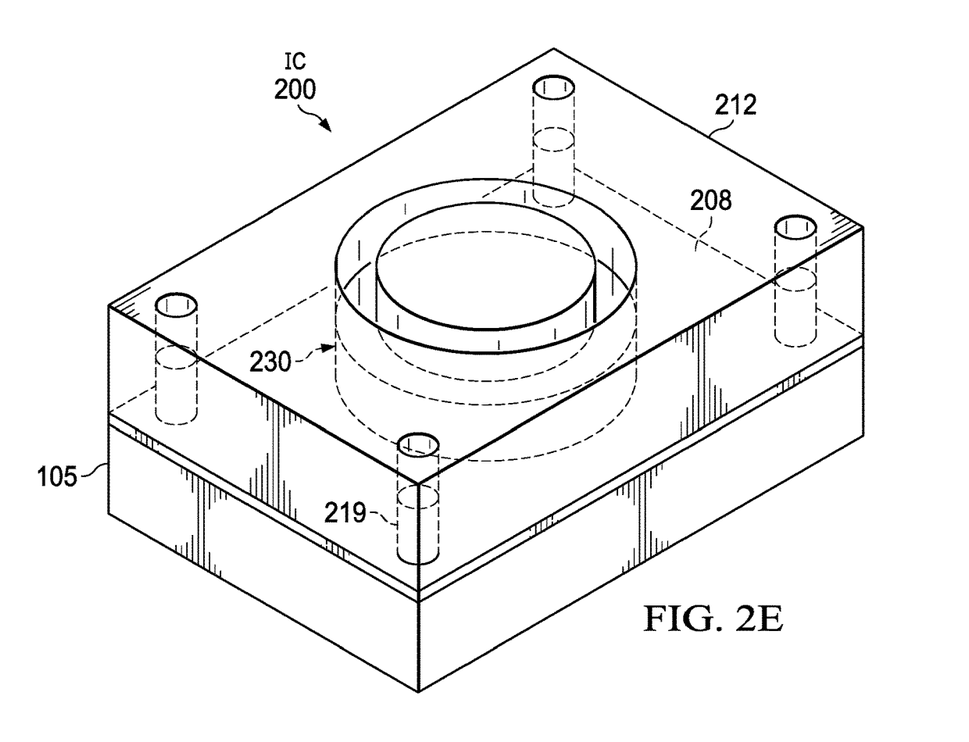
Figure 2F:
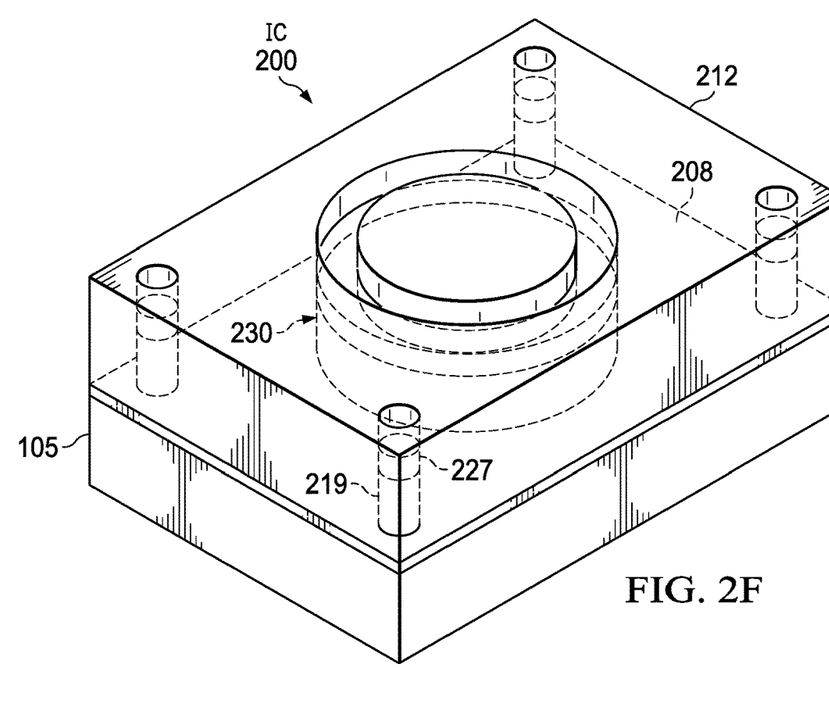
Figure 2G:
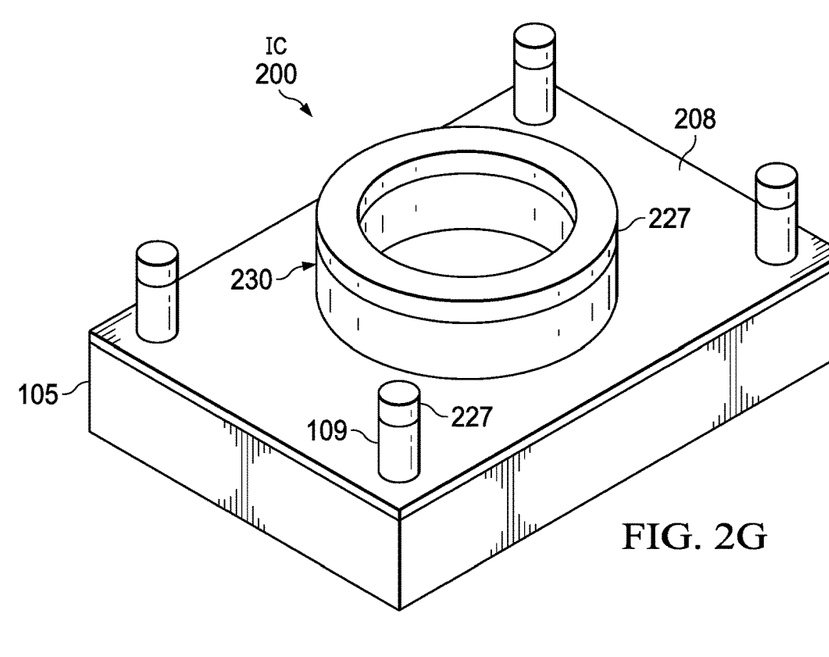
Figure 2H:
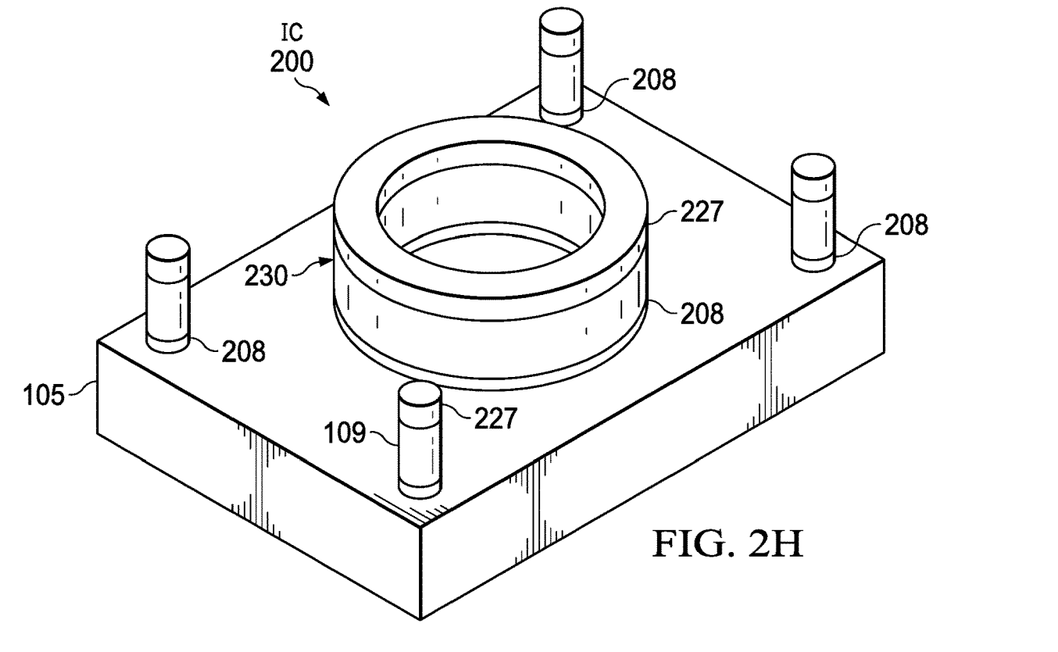
Figure 2I:
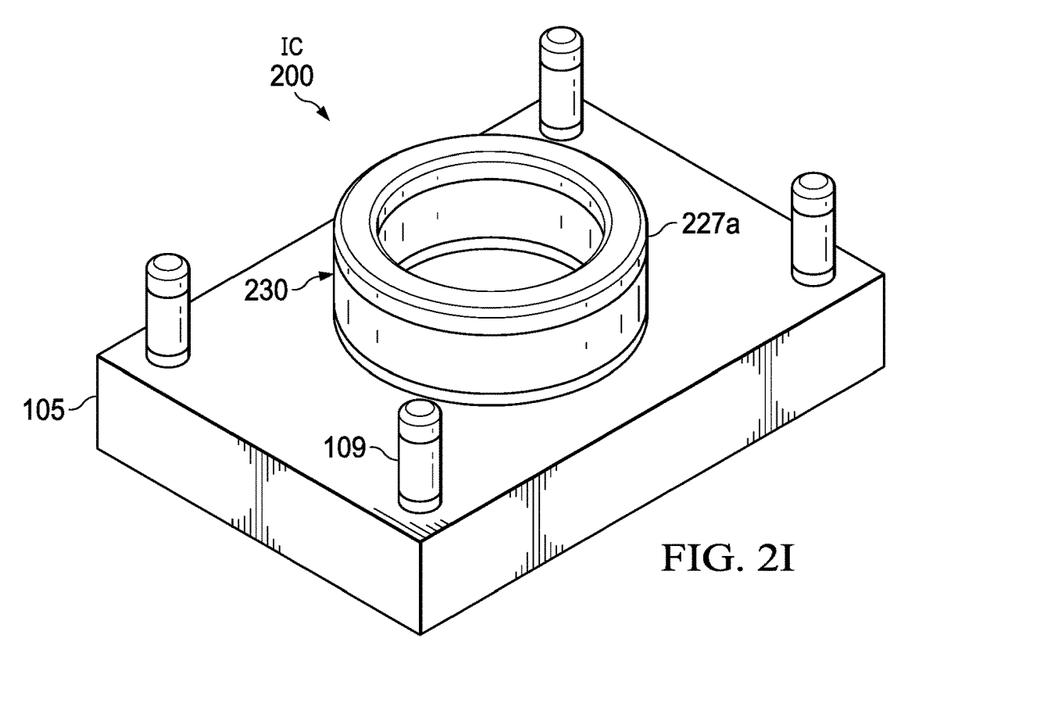
Figure 2J:
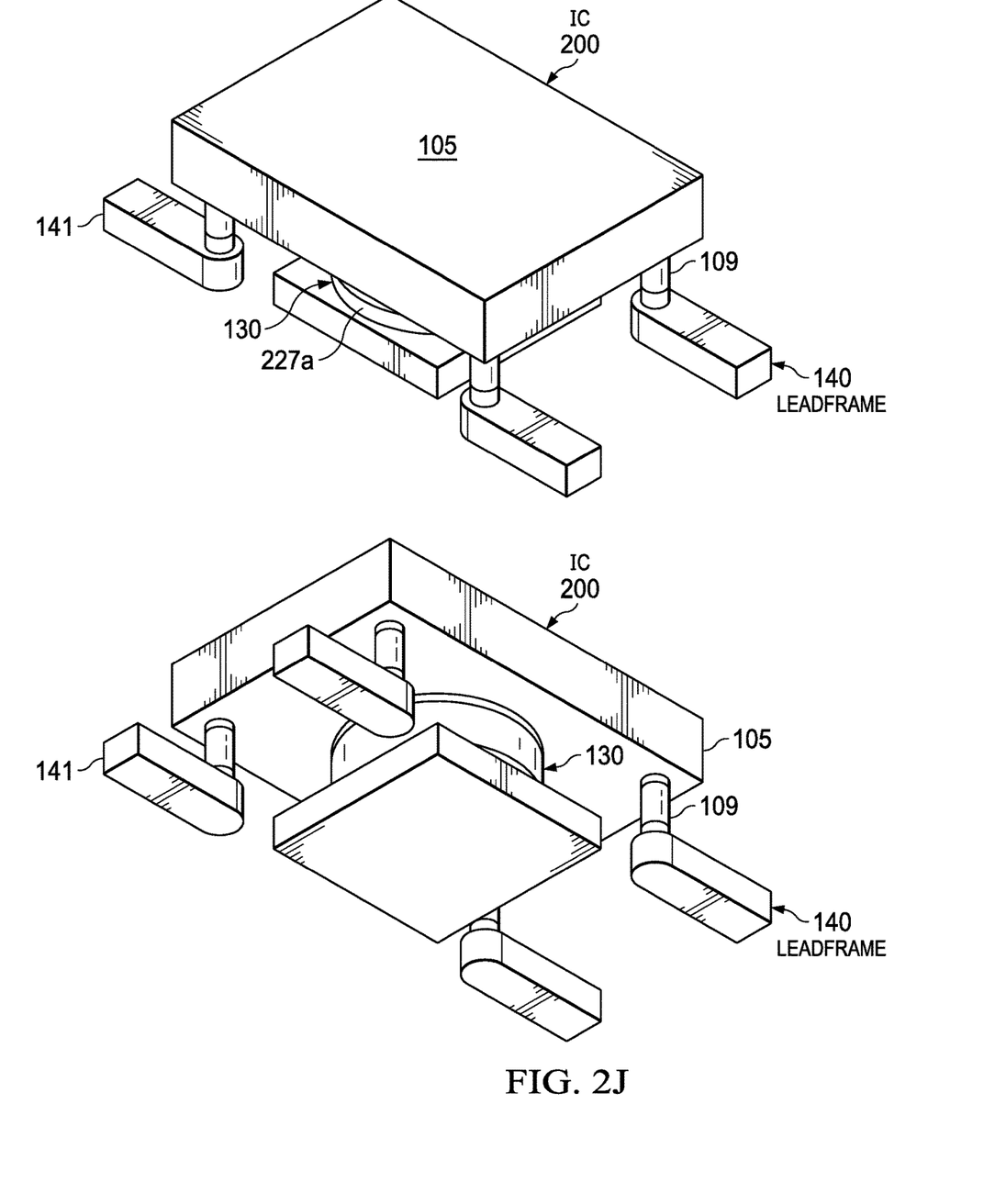

FIG. 2E shows the results for IC 200 after forming a metal, generally comprising electroplating in the case of copper as the metal, with metal being deposited within the ring pattern 211 to form a metal wall 230, and also to form pillars 219 inside the cylindrical-shaped openings 209. FIG. 2F shows the results for IC 200 after forming solder 227 on the top surface of the metal wall 230 and on the pillars 219, such as utilizing a process comprising electroplating. FIG. 2G shows the results for IC 200 after stripping the photoresist 212. FIG. 2H shows the results for IC 200 after etching to remove the seed metal layer 208 except under the metal wall 230 and the pillars 219. FIG. 2I shows the results for IC 200 after reflowing the solder 227 described above which is now shown as 227a. A plurality of the IC 200 are then singulated from a wafer having a plurality of the IC 200 to provide a plurality of singulated IC.

Figure 2K:
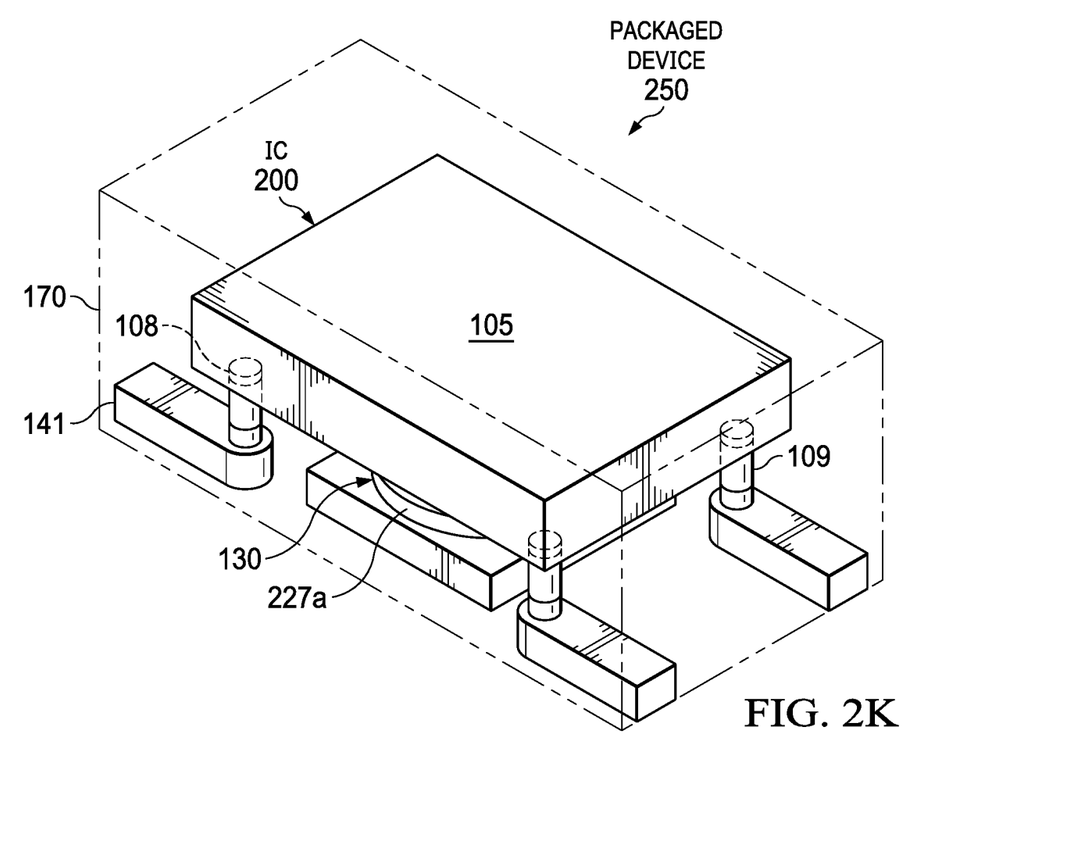
Figure 2L:
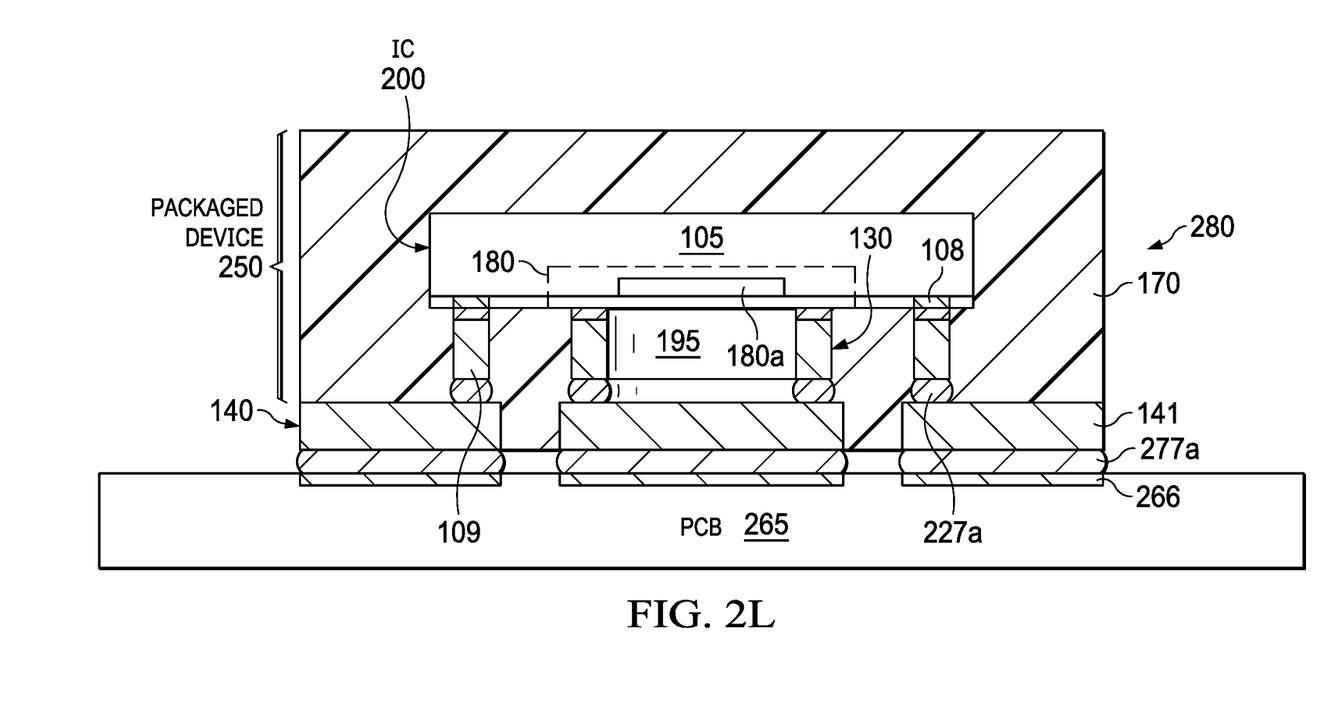
FIG. 2L shows the resulting arrangement after mounting a disclosed packaged device including an IC having a metal wall onto land pads of a PCB.

FIG. 2J shows the results after performing a flipchip die attach of the IC 200 to a leadframe 140 shown including lead terminals 141, that corresponds to what is shown in FIG. 1B described above, except for not having any mold compound at this point. FIG. 2K shows the resulting packaged device 250 after mounting the IC 200 onto a leadframe 140 and then molding to form a mold compound 170. The packaged device 250 includes a disclosed cavity shown in the cross-section as 195 over the sensitive portion (cavity 195 is shown in FIG. 2L described below) of the IC 200 framed by the metal wall 130.

FIG. 2L shows the resulting arrangement 280 after mounting a disclosed packaged device 250 including an IC 200 having a metal wall 130 onto land pads 266 of a PCB 265. Solder, shown as 277a, may be used bond the leadframe 140 to the land pads 266 of the PCB 265. A disclosed cavity 195 can also be seen within the inner area defined by the metal wall 130, and the stress sensitive circuit portion 180a can be seen to have the cavity 195 thereover, thus reducing the stress to the stress sensitive circuit portion 180a that can be caused by the mold compound 170 when it is conventionally over the stress sensitive circuit portion 180a.

Advantages of this manufacturing flow and the packaged devices formed therefrom include generally providing the best features of the plastic and ceramic packages together, even though a plastic package is used. Plastic for packaging is beneficial for size, cost, protecting the IC package interconnects, as well as the electrical and thermal performance.

As described above, the cavity 195 is for eliminating mold filler particle in the mold compound from inducing stresses on stress sensitive circuit portion(s) on the IC because the stress sensitive circuit portion(s) is closer to the stress neutral center of the IC and the package. This disclosed flow also allows for a wide range of different cavities created, where one can make small openings because the photolithography and plating processes described above are generally precise.

This embodiment can optionally be combined with stress buffers (polyimide (PI), polybenzoxazole (PBO), and silicone) and coatings. Stress buffers are coatings applied on top of the IC die prior to assembly, either in a bump or a fabrication facility, to buffer stresses from mold compound. Bond pads are not covered with the coatings to allow bonding thereto. Stress buffers can reduce but not necessarily eliminate stresses. Photolithography and plating enable parallel creation of a large number of cavities, because a whole wafer with a very large number (generally tens of thousands to hundreds of thousands) of IC can be simultaneously processed at a given time.

This disclosed flow eliminates the need for any special molding tooling and can reuse the standard molding tool with flat cavities (i.e., no special inserts). The photolithography pattern (mask) for forming the metal wall can be modified to create different sizes and shapes for the metal wall, such as circular, elliptical, rectangles with rounded corners. New sizes and shapes for the metal wall can also generally be created with minimal time, cost, and effort. One can reuse standard equipment, materials and processes for forming the metal walls and for the assembly disclosed ICs having the metal wall. Plated metal provides precise and robust shape for the cavity. This aspect provides a long and reliable operating life for the packaged device. The cavity can stress isolate only the stress sensitive portion(s) of the IC, while letting the mold compound 170 (plastic) of the package encapsulate and protect the rest of the IC. A metal wall and the metal of the leadframe also generally provides a robust hermetic enclosure for cavity. Finally, when the bumps comprise pillars, they generally comprise the same copper layer used for interconnects so that they are essentially free by-products being formed at the same time as the metal wall 130, which can eliminate bond wires and also provide a relatively low parasitic interconnect.

Figure 3A:
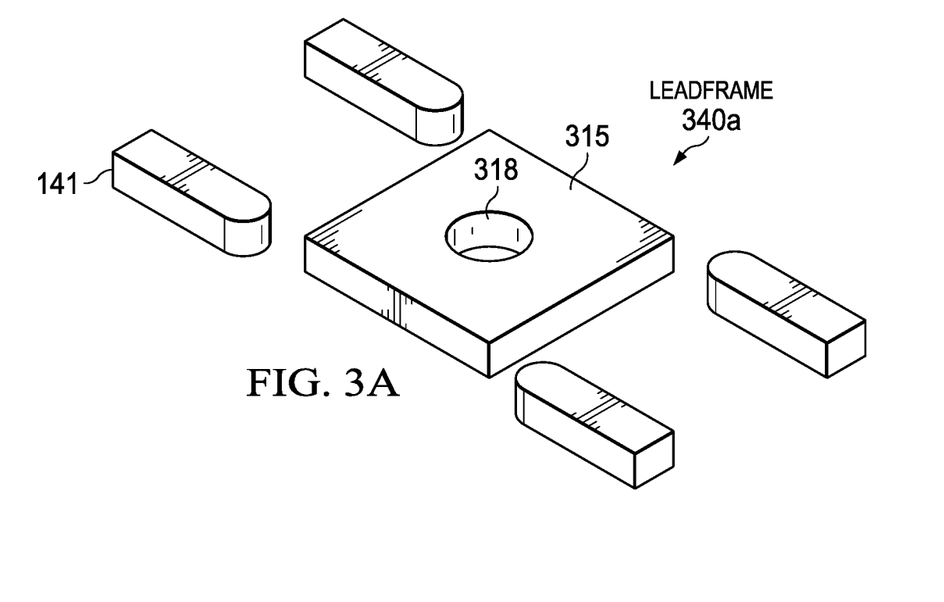
FIG. 3A shows a close-up of a leadframe that includes an opening in a center metal support region that corresponds to a location of the metal wall on the IC that will be bonded to the leadframe.
Figure 3B:
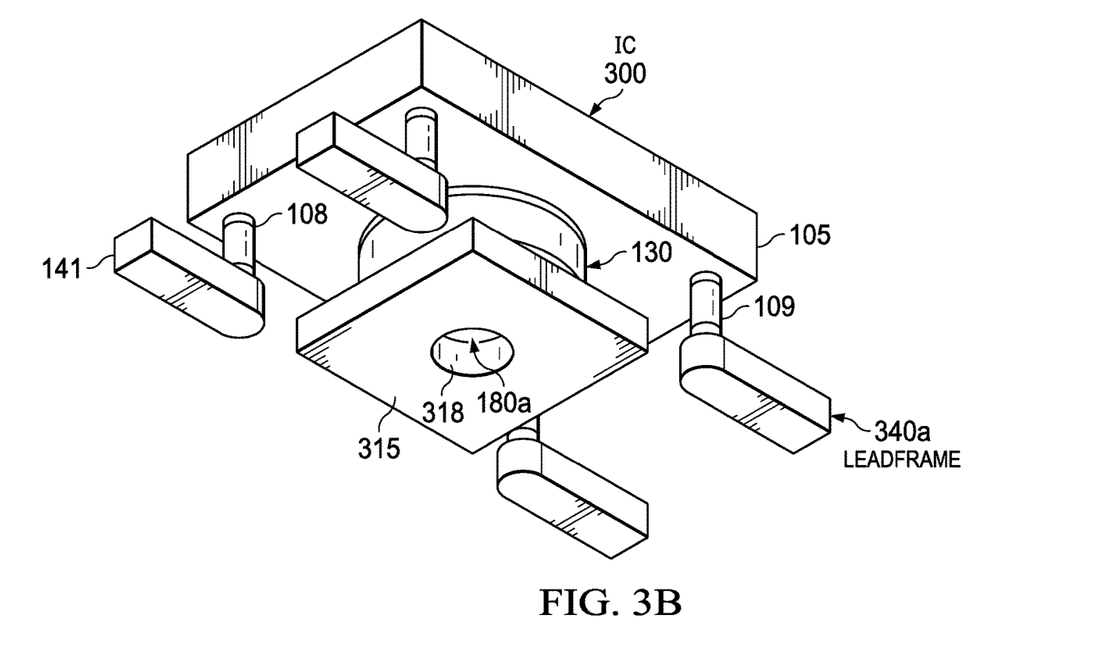
FIG. 3B corresponds to results of flipchip mounting of the IC to the leadframe shown FIG. 2J, except in this flow as described above the leadframe includes a center opening.
Figure 3C:
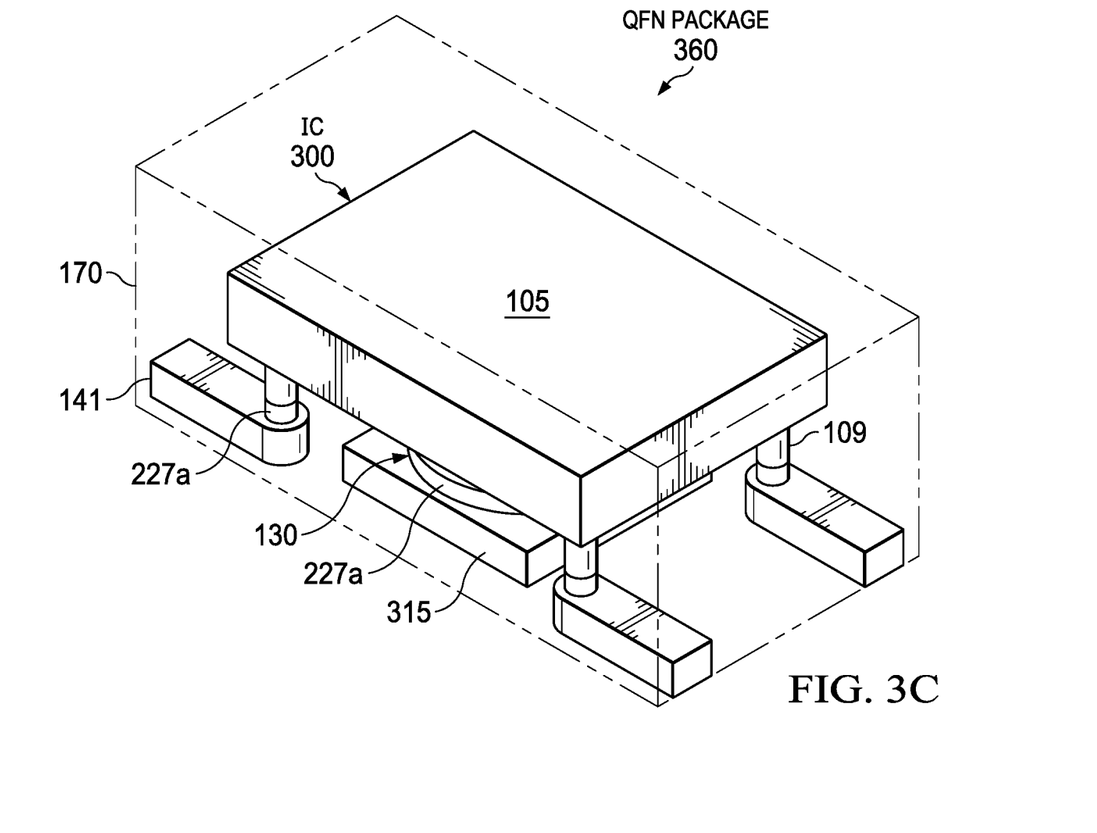
FIG. 3C corresponds to the results after molding the flipchip mounted IC on the leadframe as shown FIG. 2J, except in this flow the leadframe includes a center opening, to form a QFN package with an open cavity sensor.

FIGS. 3A-3C depict successive results from method steps for forming a packaged device comprising an open cavity sensor, where the leadframe 340a has a support region 315 having opening 318 so that the stress sensitive circuit portion(s) generally including an environmental sensor on the IC enclosed by the metal wall 130 is now exposed to the environment. This flow follows the same flow described above through FIGS. 2A-2I, so it will not be repeated in the series of FIGS. FIG. 3A shows a close-up of a leadframe 340a that includes a support region 315 with an opening 318 that corresponds to a location of the metal wall of the IC that will be bonded to the leadframe 340a. As described before, the lead terminals are shown as 141. The leadframe 340a as noted above is generally provided as part of a leadframe panel comprising a plurality of leadframes.

FIG. 3B corresponds to the results after flipchip mounting of an IC shown as 300 to the leadframe shown FIG. 2J, except in this flow as described above the leadframe 340a includes a center opening 318. The stress sensitive circuit portion 180a generally including an environmental sensor can be seen to be exposed to the environment by the opening 318. FIG. 3C corresponds to the results after molding the IC 300 to form a mold compound 170 which is subsequent to flipchip mounting the IC 300 onto the leadframe as shown FIG. 2J, except in this flow as described above the leadframe 340*a* includes a center opening 318 in the support region 315, to form a QFN package 360 that provides an open cavity sensor.

Figure 3D:
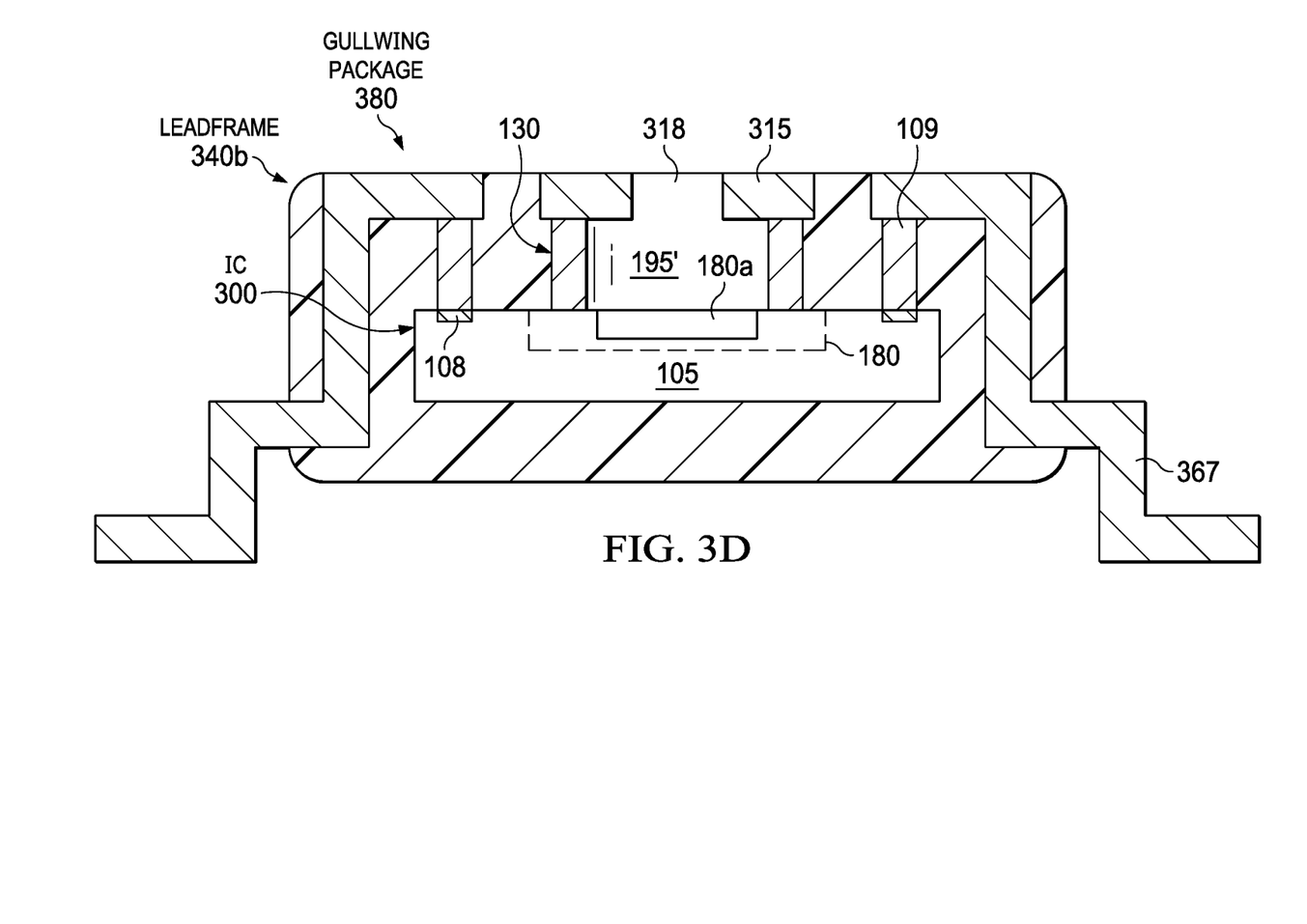
FIG. 3D shows a cross-sectional view of an example gullwing package including gullwing leads as another example of a leaded package that also implements an open cavity sensor.

The cross-sectional view in FIG. 3D shows an example gullwing package shown as 380 with the leadframe now shown as 340*b*, and with the cavity now shown as 195'. The gullwing package 380 includes gullwing leads 367 as an example of a leaded package that also implements the open cavity sensor, where the cavity 195' enabled by the opening 318 in the leadframe 340*b* enables the sensor to have access to the environment. The cavity 195' is up facing for the gullwing package 380. The leads for leaded packages need not be the gullwing type leads shown.

This disclosed flow has the same advantages described above relative to the assembly flow shown in FIGS. 2A to 2L. In addition, this disclosed assembly flow by providing a cavity 195 which is down facing as shown in FIG. 3A-3C provides protection for the sensor generally in the stress sensitive circuit portion 180*a* from dirt, debris, and cleaning fluids that could otherwise collect in the cavity. Also, this flow provides a standard package surface on the top side for conventional pick and place equipment at surface mount (SMT), such as for mounting to a PCB.

A known industry solution for high precision packaged devices is to use ceramic packaging, which is significantly more expensive as compared to conventional plastic packaging approaches that are disclosed herein. Advantages of disclosed aspects which enable plastic packaged devices include:

(a) obtaining the circuit performance of ceramic packaging, but at significantly lower cost in a plastic package by leveraging existing manufacturing technology;
(b) being applicable for both leaded and non-lead packages such as QFN, and
(c) being applicable to new designs or for re-purposing/replacing wirebond package designs (see FIG. 1C described above), such as with flipchip designs.

Disclosed aspects can be integrated into a variety of assembly flows to form a variety of different packaged devices and related products. The assembly can comprise single semiconductor die or multiple semiconductor die, such as configurations comprising a plurality of stacked semiconductor die. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BiCMOS and MEMS.

Those skilled in the art to which this Disclosure relates will appreciate that many variations of disclosed aspects are possible within the scope of the claimed invention, and further additions, deletions, substitutions and modifications may be made to the above-described aspects without departing from the scope of this Disclosure.

The invention claimed is:

1. An integrated circuit (IC), comprising:
a substrate including circuitry configured for a function, the circuitry including at least one stress sensitive circuit portion;
a solid same metal wall that is ring-shaped having opposing end surfaces, one of the end surfaces attached to the substrate and the other end surface attached to a metal pad that covers the entire other end surface, wherein the stress sensitive circuit portion is positioned with at least a majority of its area within an inner area of the substrate that is framed by the solid metal wall to provide a cavity.

2. The IC of claim 1, wherein the metal wall is a continuous wall.

3. The IC of claim 1, wherein the function the circuitry implements comprises that of an amplifier, an analog to digital converter (ADC), a digital to analog converter (DAC), a voltage reference, an environmental sensor for sensing a physical parameter, or a micro-electromechanical system (MEMS) device including at least the sensor for sensing the physical parameter.

4. The IC of claim 1, wherein a width of the metal wall is between 10 μm and 200 μm.

5. The IC of claim 1, wherein the at least one stress sensitive circuit portion comprises a first stress sensitive portion and at least a second stress sensitive portion.

6. The IC of claim 1, wherein the ring-shaped comprises a circular shape.

7. The IC of claim 1, wherein the stress sensitive circuit portion is positioned entirely within the inner area.

8. An integrated circuit (IC), comprising:
a substrate including circuitry configured for a function, the circuitry including at least one stress sensitive circuit portion;
a metal wall that is ring-shaped positioned above the top metal layer that is not electrically coupled to the circuitry;
a solid same metal wall that is ring-shaped having opposing end surfaces, one of the end surfaces attached to the substrate and the other end surface attached to a metal pad that covers the entire other end surface;
wherein the stress sensitive circuit portion is positioned with at least a majority of its area within an inner area of the substrate that is framed by the solid metal wall to provide a cavity; and
wherein the stress sensitive circuit portion comprises an environmental sensor for sensing a physical parameter.

9. A packaged device, comprising:
an integrated circuit (IC), comprising:
a substrate including circuitry configured for a function, the circuitry including at least one stress sensitive circuit portion; and
a solid metal wall having opposing end surfaces that is ring-shaped, wherein the stress sensitive circuit portion is positioned with at least a majority of its area within an inner area of the substrate that is framed by the solid metal wall to provide a cavity;
a leadframe including leads or lead terminals, and a pad, wherein one of the opposing end surfaces is coupled to the substrate and another of the opposing end surfaces is coupled to the pad; and
a mold compound providing encapsulation for the packaged device, wherein at least a portion of the mold compound is excluded from being inside the solid metal wall.

10. The packaged device of claim 9, wherein the metal wall is a continuous wall.

11. The packaged device of claim 9, wherein the function the circuitry implements comprises that of an amplifier, an analog to digital converter (ADC), a digital to analog converter (DAC), a voltage reference, a sensor for sensing a physical parameter, or a micro-electromechanical system (MEMS) device including at the sensor for sensing the physical parameter.

12. A packaged device, comprising:
an integrated circuit (IC), comprising:
a substrate including circuitry configured for a function, the circuitry including at least one stress sensitive circuit portion, with at least a portion of nodes in the circuitry electrically coupled to bond pads provided by a top metal layer, wherein there are bonding features on the bond pads, wherein the stress sensitive circuit portion comprises an environmental sensor for sensing a physical parameter, and wherein the leadframe has opening through the leadframe configured so that the stress sensitive circuit portion is exposed to an environment;
a metal wall that is ring-shaped positioned above the top metal layer that is not electrically coupled to the circuitry;
wherein the stress sensitive circuit portion is positioned with at least a majority of its area within an inner area of the substrate that is framed by the metal wall to provide a cavity;
a leadframe including leads or lead terminals;
wherein the bonding features are bonded to the leads or to the lead terminals; and
a mold compound providing encapsulation for the packaged device, wherein at least a portion of the mold compound is excluded from being inside the metal wall.

13. A packaged device, comprising:
an integrated circuit (IC), comprising:
a substrate including circuitry configured for a function, the circuitry including at least one stress sensitive circuit portion, with at least a portion of nodes in the circuitry electrically coupled to bond pads provided by a top metal layer, wherein there are bonding features on the bond pads; and
a metal wall having opposing end surfaces that is ring-shaped positioned above the top metal layer;
wherein the stress sensitive circuit portion is positioned with at least a majority of its area within an inner area of the substrate that is framed by the metal wall to provide a cavity;
a leadframe including leads or lead terminals, and a pad, wherein one of the opposing end surfaces is coupled to the substrate and another of the opposing end surfaces is coupled to the pad; and
a mold compound providing encapsulation for the packaged device, wherein at least a portion of the mold compound is excluded from being inside the solid metal wall.

14. A packaged device, comprising:
an integrated circuit (IC), comprising:
a substrate including circuitry configured for a function, the circuitry including at least one stress sensitive circuit portion, with at least a portion of nodes in the circuitry electrically coupled to bond pads provided by a top metal layer, wherein there are bonding features on the bond pads; and
a metal wall having opposing end surfaces that is ring-shaped positioned above the top metal layer, that is not electrically coupled to the circuitry;
wherein the stress sensitive circuit portion is positioned with at least a majority of its area within an inner area of the substrate that is framed by the metal wall to provide a cavity;
a leadframe including leads or lead terminals, wherein the bonding features are bonded to the leads or to the lead terminals wherein one of the opposing end surfaces of the metal wall is coupled to the substrate and another of the opposing end surfaces of the metal wall is coupled to the leadframe; and
a mold compound providing encapsulation for the packaged device, wherein at least a portion of the mold compound is excluded from being inside the cavity, wherein the leadframe provides one of an opening through the leadframe for exposing the cavity to an environment, and a lid for sealing the cavity.

15. An integrated circuit (IC), comprising:
a substrate including circuitry configured for a function, the circuitry including at least one stress sensitive circuit portion, with at least a portion of nodes in the circuitry electrically coupled to bond pads provided by a top metal layer; and
a continuous solid same metal wall having opposing end surfaces, one of the end surfaces attached to the substrate and the other end surface attached to a metal pad that covers the entire other end surface, wherein the stress sensitive circuit portion is positioned with at least a majority of its area within an inner area of the substrate that is framed by the solid metal wall.

16. A packaged device, comprising:
an integrated circuit (IC), comprising:
a substrate including circuitry configured for a function, the circuitry including at least one stress sensitive circuit portion, with at least a portion of nodes in the circuitry electrically coupled to bond pads provided by a top metal layer, wherein there are bonding features on the bond pads; and
a continuous solid metal wall positioned above the top metal layer that is not electrically coupled to the circuitry, wherein the stress sensitive circuit portion is positioned with at least a majority of its area within an inner area of the substrate that is framed by the continuous solid metal wall to provide a cavity;
a leadframe including leads or lead terminals, wherein the bonding features are bonded to the leads or to the lead terminals and having an opening through the leadframe so that the stress sensitive circuit portion is exposed to an environment; and
a mold compound providing encapsulation for the packaged device, wherein at least a portion of the mold compound is excluded from being inside the continuous solid metal wall.

17. An integrated circuit (IC), comprising:
a substrate including circuitry configured for a function including a stress sensitive circuit portion of the circuitry with at least a portion of nodes in the circuitry electrically coupled to bond pads provided by a top metal layer, wherein there are bonding features on the bond pads; and
a plurality of metal features on or above the top metal layer, including a solid same metal wall not electrically coupled to the circuitry and metal features on the bond pads or on bump pads, having opposing end surfaces, one of the end surfaces attached to the substrate and the other end surface attached to a metal pad that covers the entire other end surface, wherein the stress sensitive circuit portion is positioned with a least a majority of its area within an inner area of the substrate that is framed by the solid metal wall to provide a cavity.

18. The IC of claim 17, wherein the function the circuitry implements comprises at least one of an amplifier, an analog to digital converter (ADC), a digital to analog converter (DAC), a voltage reference, a sensor for sensing a physical parameter, or a micro-electromechanical system (MEMS) device including at the sensor for sensing the physical parameter.

19. The IC of claim 17, wherein a width of the metal wall is between 10 μm and 200 μm.

20. The IC of claim 17, wherein the stress sensitive circuit portion comprises an environmental sensor for sensing a physical parameter.

21. An integrated circuit (IC), comprising:
a substrate including circuitry configured for a function including a stress sensitive circuit portion of the circuitry;
a solid metal wall, not electrically coupled to the circuitry, having opposing end surfaces, one of the end surfaces attached to the substrate, wherein the stress sensitive circuit portion is positioned with a least a majority of its area within an inner area of the substrate that is framed by the metal wall to provide a cavity;
a metal pad attached to the other end surface and covering the entire other end surface;
a mold compound covering the IC, wherein at least a portion of the mold compound is excluded from being inside the metal wall.

22. The IC of claim 21, further including at least a portion of nodes in the circuitry electrically coupled to bond pads provided by a top metal layer, wherein there are bonding features on the bond pads, leads or lead terminals coupled to the bonding features, and wherein the leads or lead terminals are flipchip bonded to the bonding features.

23. The IC of claim 15, wherein the function the circuitry implements comprises that of an amplifier, an analog to digital converter (ADC), a digital to analog converter (DAC), a voltage reference, an environmental sensor for sensing a physical parameter, or a micro-electromechanical system (MEMS) device including at least the sensor for sensing the physical parameter.

24. The packaged device of claim 16, wherein the function the circuitry implements comprises that of an amplifier, an analog to digital converter (ADC), a digital to analog converter (DAC), a voltage reference, a sensor for sensing a physical parameter, or a micro-electromechanical system (MEMS) device including at the sensor for sensing the physical parameter.

* * * * *